(12) United States Patent
Kwak et al.

(10) Patent No.: US 7,378,739 B2
(45) Date of Patent: May 27, 2008

(54) CAPACITOR AND LIGHT EMITTING DISPLAY USING THE SAME

(75) Inventors: Won-Kyu Kwak, Suwon-si (KR); Keum-Nam Kim, Suwon-si (KR)

(73) Assignee: Samsung SDI Co., Ltd., Suwon (KR)

( * ) Notice: Subject to any disclaimer, the term of this patent is extended or adjusted under 35 U.S.C. 154(b) by 295 days.

(21) Appl. No.: 11/091,397

(22) Filed: Mar. 29, 2005

(65) Prior Publication Data

US 2005/0258466 A1   Nov. 24, 2005

(30) Foreign Application Priority Data

May 24, 2004   (KR) ...................... 10-2004-0036854
May 25, 2004   (KR) ...................... 10-2004-0037277

(51) Int. Cl.
H01L 23/48   (2006.01)
H01L 23/52   (2006.01)
H01L 29/40   (2006.01)
H01L 27/10   (2006.01)
H01L 27/108  (2006.01)

(52) U.S. Cl. ...................... 257/758; 257/207; 257/208; 257/211; 257/296; 257/297; 257/298; 257/299; 257/300; 257/306; 257/307; 257/308; 257/309; 257/310; 257/311; 257/312; 257/532; 257/535

(58) Field of Classification Search ........ 257/296–300, 257/306–313, 532, 535, 207–208, 211, 758–760
See application file for complete search history.

(56) References Cited

U.S. PATENT DOCUMENTS

| 5,508,220 | A | * | 4/1996 | Eltoukhy et al. ........... 438/600 |
| 5,629,539 | A | * | 5/1997 | Aoki et al. .................. 257/306 |
| 6,016,000 | A | * | 1/2000 | Moslehi ...................... 257/522 |
| 6,034,433 | A | * | 3/2000 | Beatty ......................... 257/758 |
| 6,054,751 | A | * | 4/2000 | Ichikawa et al. ........... 257/532 |
| 6,104,053 | A | * | 8/2000 | Nagai .......................... 257/303 |
| 6,198,123 | B1 | * | 3/2001 | Linder et al. ............... 257/306 |
| 6,303,977 | B1 | * | 10/2001 | Schroen et al. ............. 257/635 |
| 6,387,753 | B1 | * | 5/2002 | Clark ........................... 438/253 |
| 6,403,444 | B2 | * | 6/2002 | Fukuzumi et al. .......... 438/396 |
| 6,448,852 | B1 | * | 9/2002 | Compton et al. ........... 330/251 |
| 6,590,227 | B2 | * | 7/2003 | Ishikawa ..................... 257/68 |
| 6,649,955 | B2 | * | 11/2003 | Lee ............................. 257/295 |
| 6,680,514 | B1 | * | 1/2004 | Geffken et al. ............. 257/368 |
| 7,126,200 | B2 | * | 10/2006 | Seyyedy et al. ............ 257/421 |
| 7,154,162 | B2 | * | 12/2006 | Ahn et al. ................... 257/532 |
| 2004/0195601 | A1 | * | 10/2004 | Kimura et al. .............. 257/68 |
| 2004/0228068 | A1 | * | 11/2004 | Banerjee et al. ......... 361/306.3 |

FOREIGN PATENT DOCUMENTS

| JP | 2003-195809 | 7/2003 |
| KR | 10-2000-0013840 A | 3/2000 |
| KR | 10-2003-0055504 A | 7/2003 |

* cited by examiner

*Primary Examiner*—Ida M. Soward
(74) *Attorney, Agent, or Firm*—H.C. Park & Associates, PLC

(57) ABSTRACT

A capacitor including a polysilicon layer doped with impurities to be conductive, a first dielectric layer formed on the polysilicon layer, a first conductive layer formed on the first dielectric layer, a second dielectric layer formed on the first conductive layer, and a second conductive layer formed on the first dielectric layer. The second conductive layer is coupled to the polysilicon layer.

6 Claims, 11 Drawing Sheets

CAPACITOR AND LIGHT EMITTING DISPLAY USING THE SAME

CROSS REFERENCE TO RELATED APPLICATION

This application claims priority to and the benefit of Korean Patent Application No. 10-2004-0036854, filed on May 24, 2004 and Korean Patent Application No. 10-2004-0037277, filed on May 25, 2004, which are hereby incorporated by reference for all purposes as if fully set forth herein.

BACKGROUND OF THE INVENTION

1. Field of the Invention

The present invention relates to a capacitor and a light emission display panel using the same, and more particularly, it relates to a capacitor formed on a substrate and a light emission display panel including the capacitor.

2. Discussion of the Background

Generally, a flat panel display (FPD) displays images with materials arranged in a closed container formed by providing barriers between sidewalls of two substrates. Various types of FPDs include a liquid crystal display (LCD), which uses liquid crystal cells that change reflectivity in an applied electric field, a field emission display (FED), which uses phosphors excited by an electron stream, and an organic electro-luminescent display, which uses electroluminescence of organic materials.

FPDs may be driven by passive matrix and active matrix driving methods. The active matrix method uses a thin film transistor (TFT). In the passive matrix method, an anode and a cathode cross each other, and a line is selected to drive the organic light emitting cells. However, in the active matrix method, which uses a thin film transistor (TFT), each pixel electrode is coupled to the TFT, and the light emitting cell is driven in accordance with a voltage maintained by a capacitor coupled to the TFT's gate electrode.

FIG. 1 is an equivalent circuit diagram showing an organic electro-luminescent display device employing a conventional active matrix method.

Referring to FIG. 1, a pixel circuit of the organic electro-luminescent display device may include an organic electro-luminescent device (OLED), a switching transistor SM, a driving transistor DM, and a capacitor C. A source of the driving transistor DM is coupled to a power voltage $V_{DD}$, and a capacitor C is coupled between the driving transistor's gate and source. The capacitor C maintains a gate-source voltage $V_{GS}$ of the driving transistor DM for a predetermined period of time. The switching transistor SM transmits a data line $D_m$ data voltage to the driving transistor DM in response to a selection signal transmitted from a current scan line $S_n$. A cathode of the OLED is coupled to a reference voltage Vss, and the OLED emits light corresponding to a current applied thereto through the driving transistor DM.

In the active matrix method, each pixel circuit may include a TFT and a capacitor, and the TFT is driven by the voltage maintained by the capacitor for a predetermined period of time. Accordingly, each pixel circuit may continuously display images corresponding to data signals for one frame. Thus, the active matrix method is commonly used because it is superior to the passive matrix method.

FIG. 2 is a sectional view showing a configuration of a capacitor formed in a conventional display panel.

Referring to FIG. 2, a buffer layer BL is formed on a substrate ST, and a first conductive layer CL1, which forms the capacitor's first electrode, is formed on the buffer layer BL. A dielectric layer DL is formed on the conductive layer CL1, and a second conductive layer CL2, which forms the capacitor's second electrode, is formed on the dielectric layer DL. Thus, the capacitor includes the first and second conductive layers CL1 and CL2. Such a capacitor is typically formed in an area where a pixel circuit is formed, and the capacitance of the capacitor varies depending on the display panel's characteristics.

However, if using the active matrix method, the display panel's pixel area also includes a TFT. Therefore, an area in which display elements are formed may be reduced. In other words, the display panel's aperture ratio may be reduced, thereby degrading the display's quality.

In particular, an organic electro-luminescent display may use a pixel circuit having more than two capacitors and a plurality of TFTs to compensate for the driving transistor's threshold voltage, which may result in a low aperture ratio. Therefore, a capacitor occupying less space in the pixel area while providing a required capacitance is desired.

SUMMARY OF THE INVENTION

The present invention provides a multi-layered capacitor that may be used in a pixel circuit to increase the pixel's aperture ratio.

Additional features of the invention will be set forth in the description which follows, and in part will be apparent from the description, or may be learned by practice of the invention.

The present invention discloses a capacitor comprising a semiconductor layer, a first dielectric layer, a first conductive layer, a second dielectric layer, and a second conductive layer. The first dielectric layer is formed on the first semiconductor layer. The first conductive layer is formed on the first dielectric layer. The second dielectric layer is formed on the first conductive layer. The second conductive layer is formed on the second dielectric layer, and it is coupled to the first semiconductor layer.

The present invention also discloses a capacitor device comprising a polysilicon layer, a first dielectric layer, and a first conductive layer. The polysilicon layer has a first area and a second area that are formed separately, and the polysilicon layer is doped with impurities to be conductive. The first dielectric layer is formed on the polysilicon layer, and the first conductive layer is formed on the first dielectric layer. The first area and the first conductive layer form the first capacitor, and the second area and the first conductive layer form the second capacitor.

The present invention also discloses a display device comprising a scan line, a data line, and a pixel circuit coupled to the scan line and the data line. The scan line extends in a first direction and transmits a selection signal. The data line extends in a second direction while dielectrically crossing the scan lines, and it transmits a data signal. The pixel circuit is coupled to the scan line and the data line. The pixel circuit comprises a first transistor, a capacitor, a second transistor, and a light emission element. The first transistor is coupled to the data line. The capacitor charges a voltage corresponding to the data signal transmitted from the data lines through the first transistor. The second transistor has a control electrode coupled to a first electrode of the capacitor. The light emission element is coupled to the second transistor. The capacitor comprises a first conductive layer, a first dielectric layer, a second conductive layer, a second dielectric layer, and a third conductive layer. The first conductive layer is an impurity-doped polysilicon layer, and the first dielectric layer is formed on the first conductive layer. The second conductive layer is formed on the first dielectric layer, and the second dielectric layer is formed on the second conductive layer. The third conductive layer is formed on the second dielectric layer and coupled to the first conductive layer.

The present invention also discloses a display device comprising a scan line, a data line, and a pixel circuit. The scan line extends in a first direction and transmits a selection signal. The data line extends in a second direction crossing the scan lines, and it transmits a data signal. The pixel circuit is coupled to the scan line and the data line. The pixel circuit comprises a first transistor, a first capacitor, a second transistor, a second capacitor, and a light emission element. The first transistor has a first electrode and a second electrode. The first electrode is coupled to the data line, and the second electrode is turned on in response to the selection signal and outputs the data signal. The first capacitor has a first electrode coupled to the second electrode of the first transistor, and it is charged with a voltage corresponding to the data signal. The second transistor outputs a current corresponding to a voltage stored in the first capacitor. The second capacitor has a first electrode coupled to the first electrode of the first capacitor in series. The light emission element is coupled to the second transistor. The pixel circuit is formed in a pixel area comprising a first conductive layer, a first dielectric layer, and a second conductive layer. The first conductive layer has a first conductive area and a second conductive area. The first conductive area forms a second electrode of the first capacitor, and the second conductive area forms a second electrode of the second capacitor. The first dielectric layer is formed on the first conductive layer. The second conductive layer forms the first electrode of the first and second capacitors.

The present invention also discloses a display panel comprising a scan line, a data line, and a pixel circuit. The scan line extends in a first direction and transmits a selection signal. The data line extends in a second direction crossing the scan line, and it transmits a data current. The pixel circuit is coupled to the scan line and the data line. The pixel circuit comprises a first transistor, a second transistor, a third transistor, a first capacitor, a second capacitor, and a light emission element. The first transistor is turned on responding to the selection signal, and it transmits the data current. The second transistor outputs a current corresponding to the data current. The first capacitor is coupled between source and gate electrodes of the second transistor. The second capacitor is coupled between a signal control line and the gate electrode of the second transistor, and coupled to the first capacitor to control a voltage applied to the gate electrode of the second transistor. The third transistor is turned on by the selection signal, and it transmits the data current to the drain electrode of the second transistor. The light emission element is coupled to the second transistor. The first and second capacitors are formed in an area comprising a first polysilicon layer, a first dielectric layer, and a first conductive layer. The first polysilicon layer is doped with impurities to be conductive, and it has a first area forming the first electrode of the first capacitor and a second area forming the first electrode of the second capacitor. The first dielectric layer is formed on the first polysilicon layer. The first conductive layer is formed on the first dielectric layer and it forms the second electrodes of the first and second capacitors.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which included to provide a further understanding of the invention and are incorporated in and constitute a part of the specification, illustrate embodiments of the invention, and together with the description, serve to explain the principles of the invention.

DETAILED DESCRIPTION OF THE ILLUSTRATED EMBODIMENTS

Figure 1:
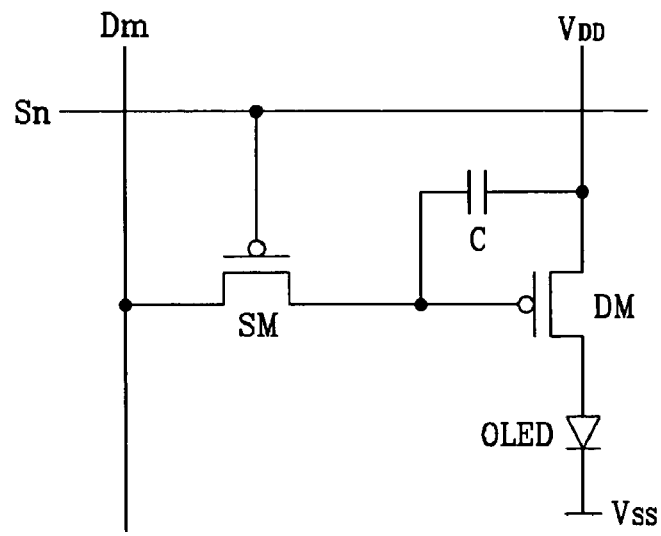
FIG. 1 shows an equivalent pixel circuit diagram of a general organic EL display panel.

The following detailed description shows and describes exemplary embodiments of the present invention. As those skilled in the art would realize, the described embodiments may be modified in various different ways, all without departing from the spirit or scope of the present invention. Accordingly, the drawings and description are to be regarded as illustrative in nature, and not restrictive.

There may be parts shown in the drawings, or parts not shown in the drawings, that are not discussed in the specification as they are not essential to a complete understanding of the invention. Like reference numerals designate like elements. Phrases such as "coupling one thing to another" can refer to either directly coupling a first one to a second one or coupling the first one to the second one with other one(s) provided therebetween.

Figure 3:
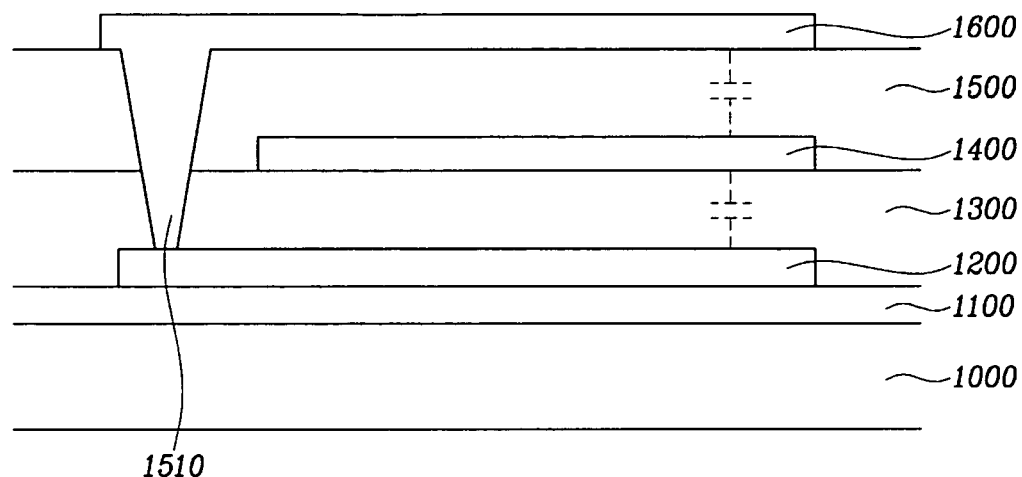
FIG. 3 shows a structure of a multi-layered capacitor according to a first exemplary embodiment of the present invention.

FIG. 3 is a sectional view showing a multi-layered capacitor according to the first exemplary embodiment of the present invention.

Referring to FIG. 3, a buffer layer 1100 may be formed on a substrate 1000, and a polycrystalline silicon (polysilicon) layer 1200, doped with impurities, may be formed on the buffer layer 1100 as the capacitor's first conductive layer. A dielectric layer 1300 may be formed on the polysilicon layer 1200. A metal electrode layer 1400 may be formed on the dielectric layer 1300 as the capacitor's second conductive layer. Thus, the capacitor includes the polysilicon layer 1200 as a first electrode layer and the metal electrode layer 1400 as a second electrode layer. Additionally, a dielectric layer 1500 may be formed on the metal electrode 1400, and a metal electrode layer 1600 may be formed on the dielectric layer 1500. The metal electrode layer 1600 may be coupled to the polysilicon layer 1200 through a cavity 1510. Accordingly, the metal electrode layer 1600 and the polysilicon layer 1200 may have the same potential, and the metal electrode layer 1600 becomes part of the first electrode layer of the capacitor.

In other words, the polysilicon layer 1200 and the metal electrode layer 1600 form the capacitor's first electrode layer, and the metal electrode layer 1400 forms the capacitor's second electrode layer. The first electrode layer comprises a lower layer and an upper layer overlapping the second electrode layer, thereby widening the capacitor's conductive layers. Accordingly, the capacitor's capacitance may increase.

Figure 2:
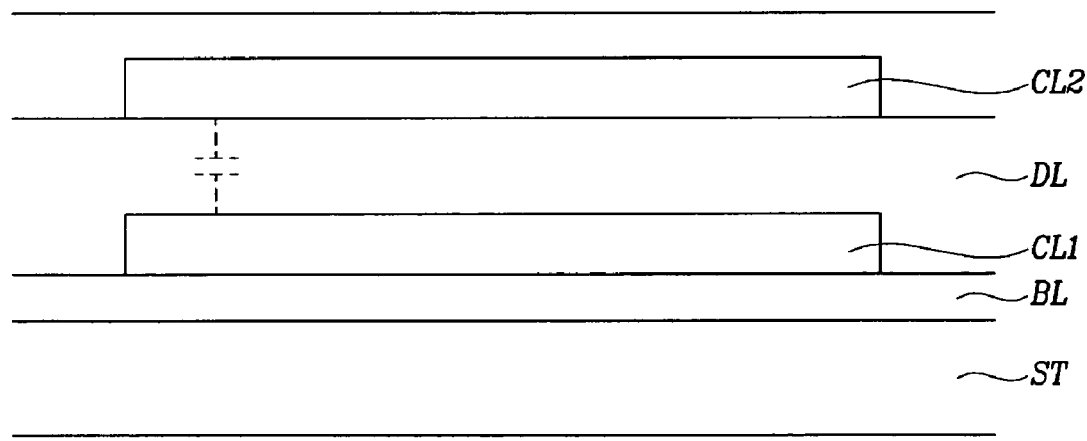
FIG. 2 schematically shows a capacitor configuration formed on a conventional display panel.

The size of the triple-layered capacitor may be reduced, but its capacitance may still be the same as that of the conventional double-layered capacitor of FIG. 2. Accordingly, the triple-layered capacitor may occupy less space in the display panel's pixel area, thereby increasing the panel's aperture ratio.

Hereinafter, an organic electro-luminescent display device according to a second exemplary embodiment will be described with reference to FIG. 4, FIG. 5, FIG. 6, FIG. 7 and FIG. 8. Herein, a "current scan line" refers to a scan line transmitting a current selection signal, a "previous scan line" refers to a scan line that transmitted a selection signal before the current selection signal, a "next scan line" refers to a scan line transmitting a selection signal after the current selection signal. Further, reference numerals in the Figures refer to elements of a current pixel Pn, and elements of a previous pixel use the same reference numerals assigned to the current pixel Pn with an apostrophe (') added thereto.

Figure 4:
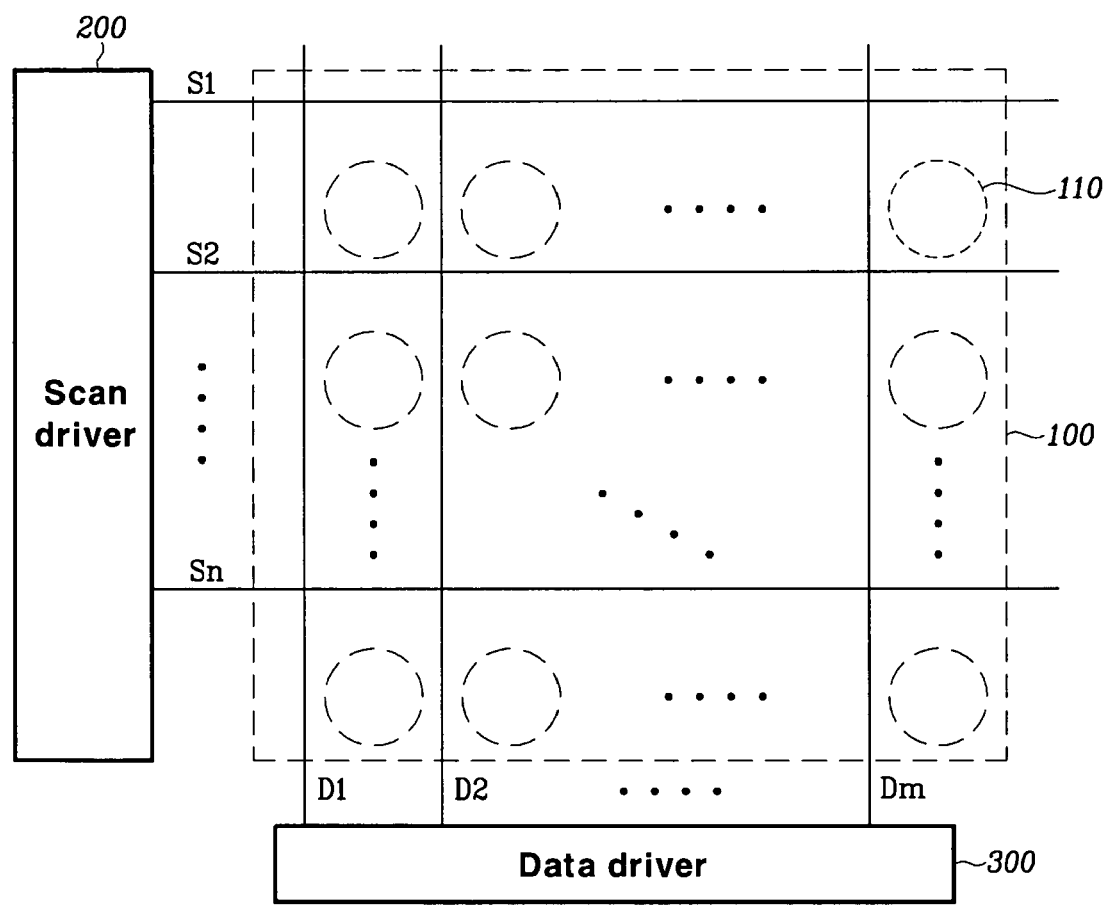
FIG. 4 schematically shows a configuration of an organic electro-luminescent display device according to a second exemplary embodiment of the present invention.

FIG. 4 schematically illustrates a configuration of an organic electro-luminescent display device according to the second exemplary embodiment of the present invention.

Referring to FIG. 4, the organic electro-luminescent display device includes a display panel 100, a scan driver 200, and a data driver 300.

The display panel 100 includes a plurality of data lines $D_1$ to $D_m$ arranged in columns, a plurality of scan lines $S_1$ to $S_n$ arranged in rows, and a plurality of pixel circuits 110. The data lines $D_1$ to $D_m$ transmit data signals as image signals to the pixel circuits 10, and the scan lines $S_1$ to $S_n$ transmit selection signals to the pixel circuits. A pixel circuit is formed in a pixel area defined by two adjacent data lines and two adjacent scan lines.

The scan driver 200 may sequentially apply the selection signals to the scan lines $S_1$ to $S_n$, and the data driver 300 applies a data voltage corresponding to the image signals to the data lines $D_1$ to $D_m$.

Figure 5:
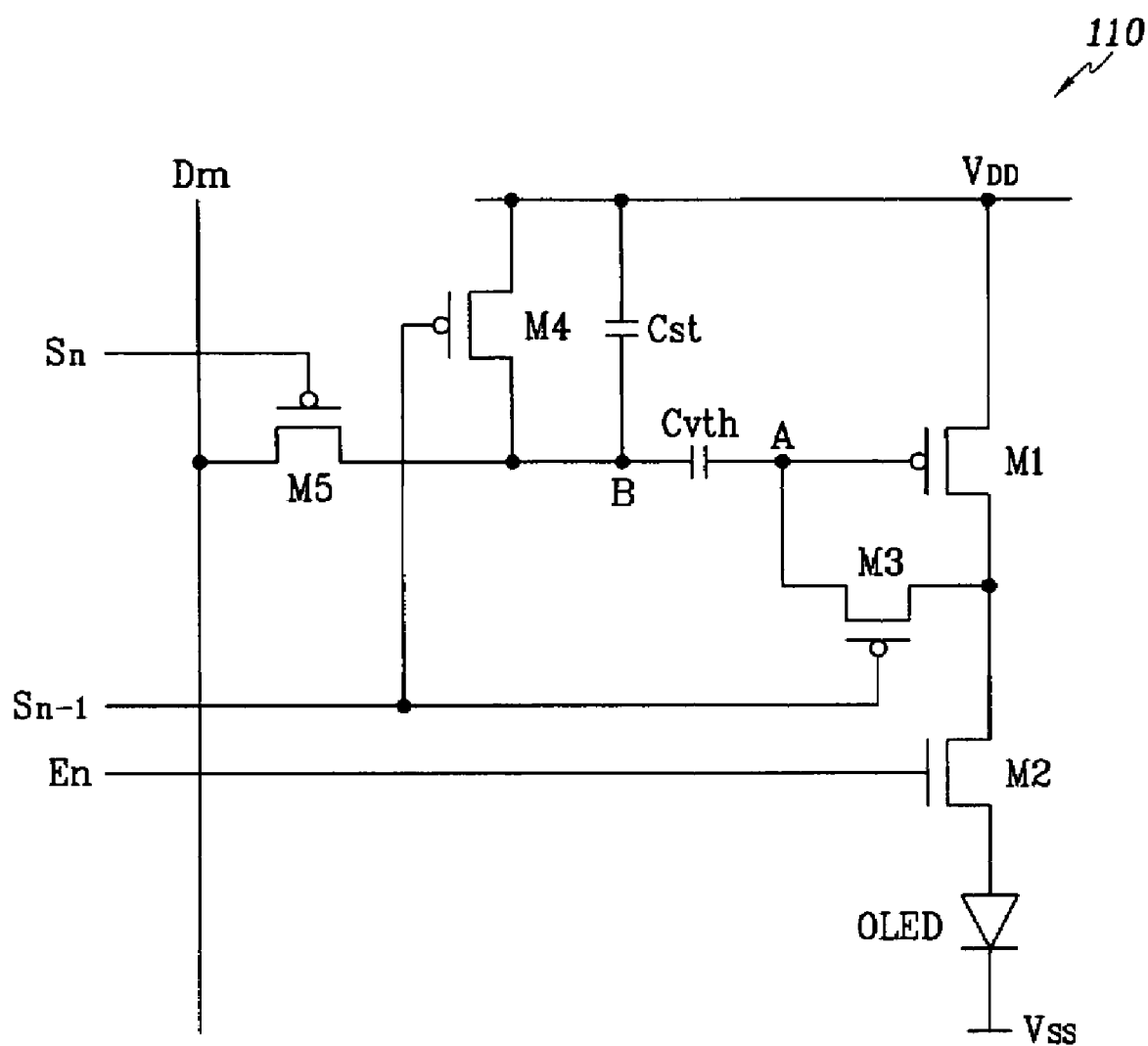
FIG. 5 is an equivalent circuit diagram showing the pixel circuit of the organic electro-luminescent display of FIG. 4.

FIG. 5 is an equivalent circuit diagram of the pixel circuits 110 according to the second exemplary embodiment of the present invention. The pixel circuit of FIG. 5 is coupled to an $m^{th}$ data line $D_m$, the current scan line $S_n$, and the previous scan line $S_{n-1}$.

As FIG. 5 shows, the pixel circuit 110 may include transistors M1, M2, M3, M4 and M5, capacitors Cst and Cvth, and an OLED.

The transistor M1 drives the OLED, and it may be coupled between a power $V_{DD}$ and the OLED. The transistor M1 controls a current flowing to the OLED, via the transistor M2, according to a voltage applied to its gate. The gate of the transistor M1 may be coupled to a node A of the capacitor Cvth, and the capacitor Cst and the transistor M4 may be coupled in parallel to each other between a node B of the capacitor Cvth and the power $V_{DD}$.

The transistor M5 transmits a data voltage from the data line $D_m$ to the node B of the capacitor Cvth in response to the selection signal from the current scan line $S_n$. In response to the selection signal transmitted from the previous scan line $S_{n-1}$, the transistor M4 couples the node B of the capacitor Cvth to the power $V_{DD}$, and the transistor M3 diode-connects the transistor M1. The transistor M2 may be coupled between a drain of the transistor M1 and the OLED's anode, and it isolates the drain of the transistor M1 from the OLED in response to a selection signal transmitted from an emission control line En. The OLED emits light corresponding to a current inputted through the transistor M2.

Hereinafter, a pixel circuit operation will be described in detail.

First, a low-level scan voltage applied to the previous scan line Sn-1 turns on the transistor M3, thereby diode-connecting the transistor M1. A voltage between the gate and the source of the transistor M1 changes until it equals the transistor's threshold voltage Vth. Herein, the source of the transistor M1 is coupled to the power $V_{DD}$. Therefore, the voltage applied to the gate of the transistor M1 (i.e. a voltage applied to the node A of the capacitor Cvth), becomes the sum of the power $V_{DD}$ and the threshold voltage Vth. Further, the low-level scan voltage applied to the previous scan line Sn-1 also turns on the transistor M4, thereby applying the power $V_{DD}$ to the node B of the capacitor Cvth. Equation 1 gives a voltage $V_{Cvth}$ charged to the capacitor $C_{vth}$.

$$V_{Cvth} = V_{CvthA} - V_{CvthB} = (VDD + Vth) - VDD = Vth \quad \text{[Equation 1]}$$

where $V_{Cvth}$ is a voltage charged to the capacitor Cvth, $V_{CvthA}$ is a voltage applied to the node A of the capacitor Cvth, and $V_{CvthB}$ is a voltage applied to the node B of the capacitor Cvth.

Further, a low-level signal of the emission control line $E_n$ turns off the transistor M2, which has an N-type channel, thereby preventing current from flowing to the OLED. Herein, the transistor M5 is turned off since a high-level signal is applied to the current scan line $S_n$.

Applying the low-level scan voltage to the current scan line Sn turns on the transistor M5, thereby applying a data voltage Vdata to the node B. Herein, since the capacitor Cvth is charged with the threshold voltage Vth, the sum of the data voltage Vdata and the threshold voltage Vth is applied to the gate of the transistor M1. Equation 2 gives the gate-source voltage $V_{GS}$ of the transistor M1. Herein, the low-level signal is applied to the emission control line $E_n$ and the transistor M2 is off.

$$V_{GS} = (Vdata + Vth) - VDD \quad \text{[Equation 2]}$$

A high-level signal of the emission control line En turns on the transistor M2, thereby applying a current $I_{OLED}$ corresponding to the gate-source voltage $V_{GS}$ of the transistor M1 to the OLED, which emits light. Equation 3 gives the current $I_{OLED}$.

$$I_{OLED} = \frac{\beta}{2}(V_{GS} - Vth)^2 \quad \text{[Equation 3]}$$

$$= \frac{\beta}{2}((\text{Vdata\_Vth} - VDD) - Vth)^2$$

$$= \frac{\beta}{2}(VDD - Vdata)^2$$

where the $I_{OLED}$ is a current flowing to the OLED, $V_{GS}$ is a source-gate voltage of the transistor M1, Vth is the threshold voltage of the transistor M1, Vdata is a data voltage, and $\beta$ is a constant.

In the pixel circuit according to exemplary embodiments of the present invention, the capacitor Cvth compensates for the different threshold voltages of the transistors M1 provided in the pixel circuits. Consequently, a more uniform current may flow to the OLED.

Figure 6:
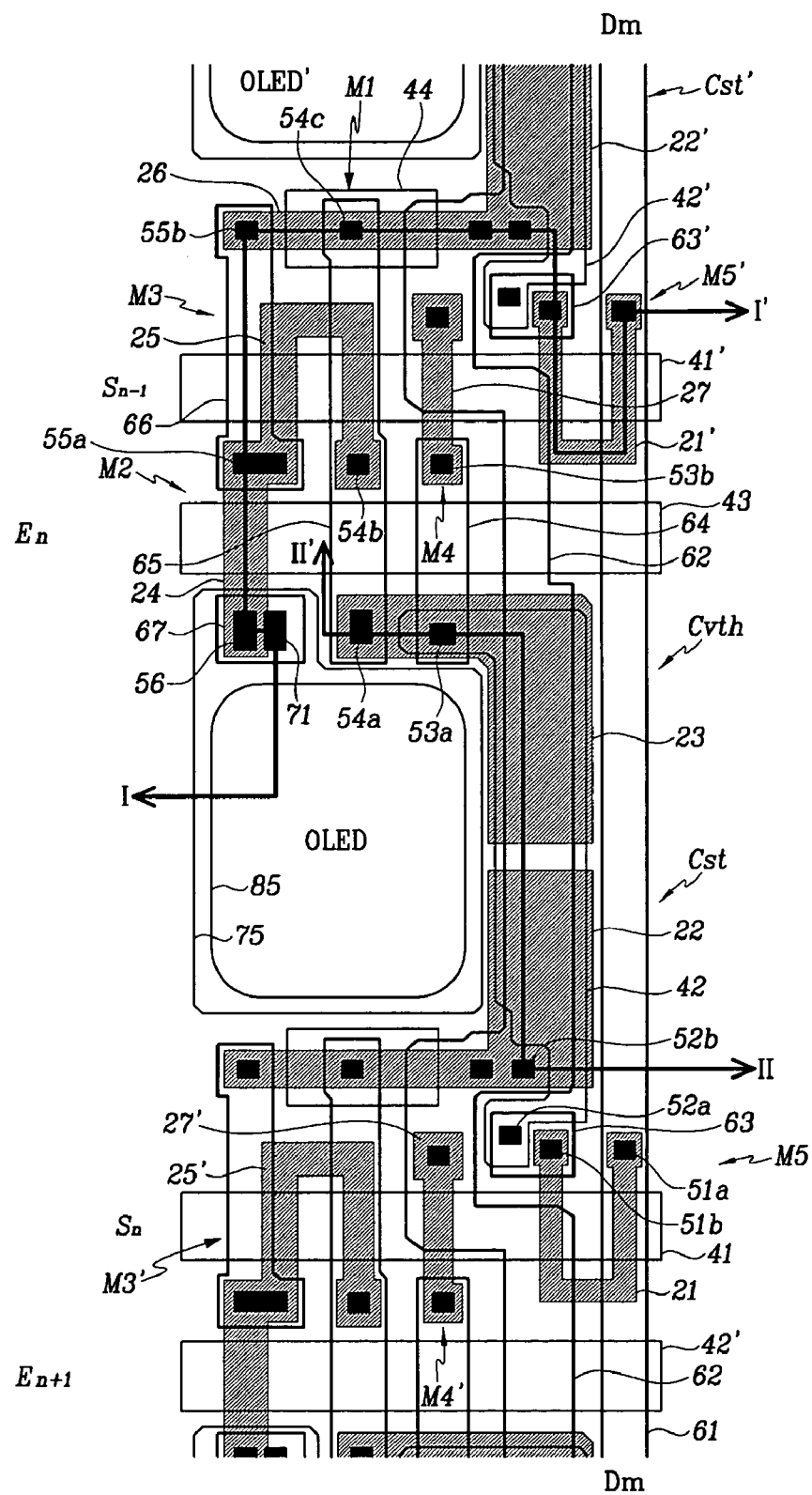
FIG. 6 shows an arrangement of the pixel circuit of FIG. 5 according to the second exemplary embodiment of the present invention.
Figure 7:
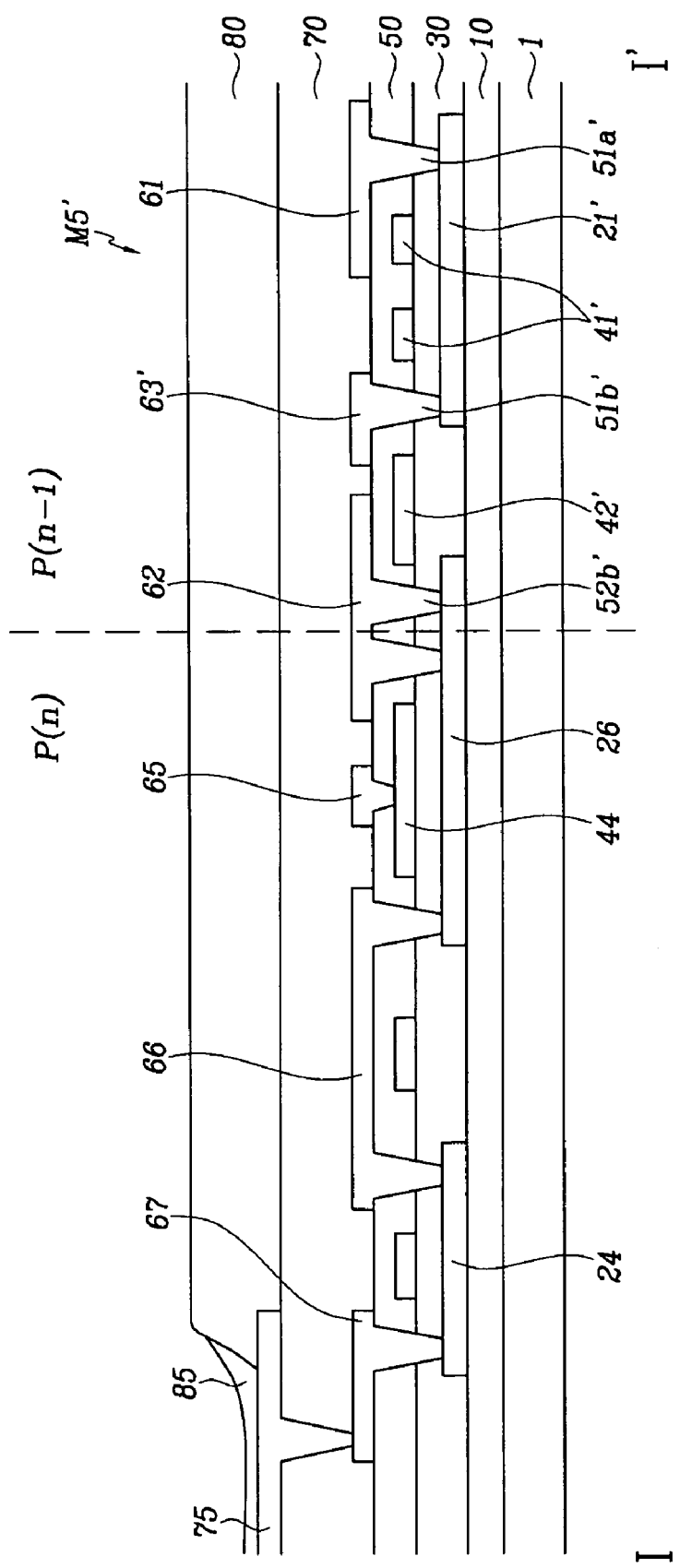
FIG. 7 is a sectional view taken along line I~I' of FIG. 6.
Figure 8:
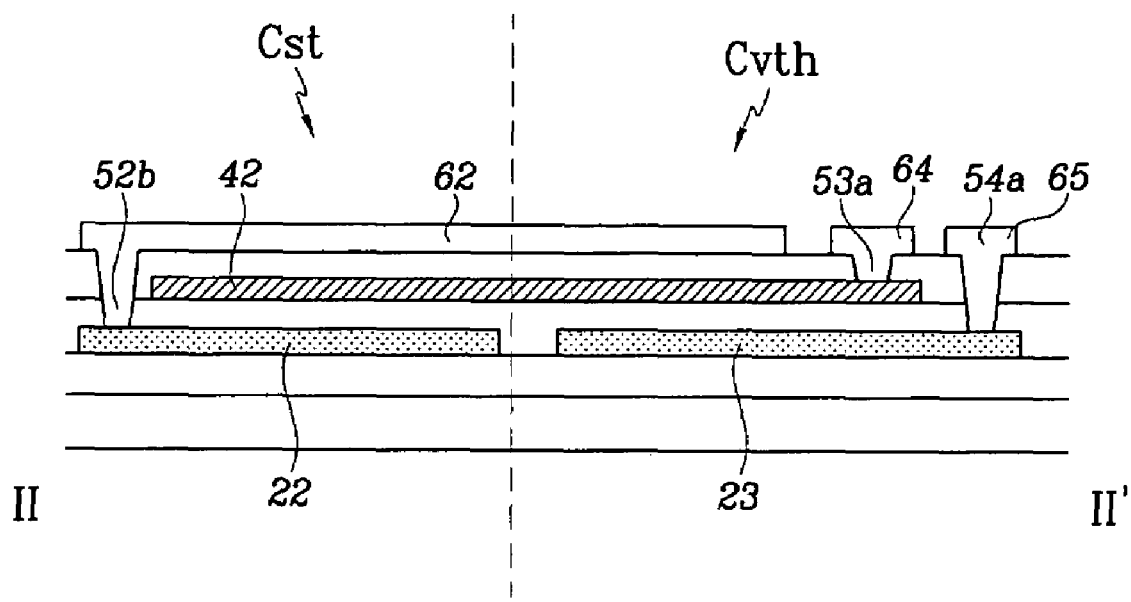
FIG. 8 is a sectional view taken along line II~II' of FIG. 6.

FIG. 6 is a plane view showing an arrangement of the pixel circuit of FIG. 5 according to the second exemplary embodiment of the present invention, FIG. 7 is a sectional view taken along the line I~I' of FIG. 6, and FIG. 8 is a sectional view taken along the line II~II' of FIG. 6.

Referring to FIG. 6 and FIG. 7, a buffer layer 10, which may include an oxide-silicon, may be formed on a dielectric substrate 1, and polysilicon layers 21, 22, 23, 24, 25, 26, and 27 may be formed on the buffer layer 10.

The polysilicon layer 21, as a semiconductor layer, may have a 'U' shape, it may be formed in a lower right portion of FIG. 6, and it may include a source, a drain, and a channel area of the transistor M5. The polysilicon layer 22 may be arranged in a column direction at the right side of the OLED, and it forms a first electrode of the capacitor Cst in a current pixel circuit. The polysilicon layer 23 is adjacent to an end of the polysilicon layer 22, and it may form a second electrode (node A) of the capacitor Cvth. The polysilicon layer 24 may be arranged in a column direction, and it includes a source, a drain, and a channel area of the transistor M2. The polysilicon layer 25 may be coupled to the polysilicon layer 24, and it forms a source, a drain, and a channel area of the transistor M3. The polysilicon layer 26 may be arranged in a row direction, it is adjacent to the polysilicon layer 25, and it forms a drain, a source, and a channel area of the transistor M1. The polysilicon layer 21', which may have a 'U' shape, may be formed in an area adjacent to the polysilicon layer 27, and it forms a source, a drain, and a channel area of a switching transistor M5' of a previous pixel circuit. Herein, the polysilicon layers 22 and 23 forming the first and second electrodes of the capacitors Cst and Cvth, respectively, may have the same doping density as one of the polysilicon layers 21, 24, 25, and 26.

A gate dielectric layer 30 may be formed on the polysilicon layers 21, 22, 23, 24, 25, 26, and 27.

Gate electrode lines may be formed on the gate dielectric layer 30. In detail, a gate electrode 41, which corresponds to the current scan line $S_n$, an electrode 42, which forms the second and first electrodes of the capacitors Cst and Cvth, respectively, a gate electrode 43, which corresponds to the emission control line $E_n$, and a gate electrode 44 of the driving transistor M1 may be formed on the gate dielectric layer 30.

The gate electrode 41 may be arranged in a row direction to cross the polysilicon layer 21, and it becomes a gate electrode of the transistor M5. Further, the gate electrode 41 crosses the polysilicon layers 25' and 27', and it forms gate electrodes of a transistor M3' and a transistor M4' of a next pixel circuit. The electrode 42, arranged in a column direction, may overlap the polysilicon layers 22 and 23, and it forms coupling electrodes (node B) of capacitors Cst and Cvth in the current pixel Pn. The gate electrode 43 may be arranged in the row direction to be parallel with the gate electrode 41, and it forms a gate electrode of the transistor M2. The gate electrode 44 is of a polygonal shape, and it may be formed in a middle area of the polysilicon layer 26 to form a gate electrode of the transistor M1 in the current pixel circuit Pn. A gate electrode 41' corresponds to the previous scan line Sn-1, and it is arranged in a row direction to be parallel with the gate electrode 41. Further, the gate electrode 41' may cross the poly silicon layers 25 and 27, and it forms gate electrodes of transistors M3 and M4 of the current pixel circuit Pn.

An interlayer dielectric 50 may be formed on the gate electrodes 41, 43, and 44, and on the electrode 42. A data line 61, a power electrode line 62, and electrodes 63, 64, 65, 66, and 67 may be formed on the interlayer dielectric 50.

The data line 61 extends in a column direction, and it may be coupled to the polysilicon layer 21, through a cavity 51a penetrating the interlayer dielectric 50 and the gate dielectric 30, to form a source electrode of the transistor M5. The electrode 63 is adjacent to the data line 61, and it couples the drain of the transistor M5 and the node B of the capacitor Cvth by coupling the polysilicon layer 21 and the electrode 42 through a cavity 51b penetrating the interlayer dielectric 50 and the gate dielectric 30 and a cavity 52a penetrating the interlayer dielectric 50. The power electrode line 62 may be coupled to the polysilicon layer 22 through a cavity 52b penetrating the interlayer dielectric 50 and the gate dielectric 30, and it supplies a power to the first electrode of the capacitor Cst.

The electrode 64 may be coupled to the electrode 42 through a cavity 53a penetrating the interlayer dielectric 50, and it may be coupled to the polysilicon layer 27 through a cavity 53b penetrating the interlayer dielectric 50 and the gate dielectric 30, thereby coupling the first electrode (node B) of the capacitor Cvth and the drain of the transistor M4. The electrode 65 may be coupled to the polysilicon layers 23 and 25 and the gate electrode 44 through cavities 54a and 54b penetrating the interlayer dielectric 50 and the gate dielectric 30 and a cavity 54c penetrating the interlayer dielectric 50, thereby coupling a second electrode (node A) of the capacitor Cvth, a drain of the transistor M3, and a gate electrode of the transistor M1. The electrode 66 may be coupled to the polysilicon layers 24, 25 and 26 through cavities 55a and 55b penetrating the interlayer dielectric 50 and the gate dielectric 30, thereby coupling the source of the transistor M3, the drain of the transistor M1, and the source of the transistor M2. The electrode 67 may be coupled to the polysilicon layer 24 through a cavity 56 penetrating the interlayer dielectric 50 and the gate dielectric 30 to form a drain of the transistor M2.

A planarization film 70 may be formed covering the data line 61, the power electrode line 62, and the electrodes 63, 64, 65, 66, and 67. A pixel electrode 75 may be coupled to the electrode 67 through a cavity 71 penetrating the planarization film 70, thereby coupling the pixel electrode to a drain of the transistor M2. A pixel defining layer 80 may be formed after forming the pixel electrode 75, and an organic layer 85, which may include an emission layer (EML), an electron transport layer (ETL), and a hole transport layer (HTL), may be formed on the pixel electrode 75.

As described, the capacitors Cst and Cvth are coupled in series and have an electrode as a common electrode in an area adjacent to the OLED.

FIG. 8 shows detailed structures of the capacitors Cst and Cvth.

Referring to FIG. 8, the polysilicon layer 22 and the power line 62 may have the same potential since they are coupled together through the cavity 52b. Hence, the polysilicon layer 22 and the power line 62 are a first electrode of the capacitor Cst. The electrode 42 is a second electrode (node B) of the capacitor Cst. The capacitor Cvth is coupled to the capacitor Cst in series, and it has the electrode 42 as its first electrode, and the polysilicon layer 23 is its second electrode. Accordingly, the electrode 42 is the second electrode of the capacitor Cst and the first electrode of the capacitor Cvth.

According to the multi-layered capacitor Cst of exemplary embodiments of the present invention, two coupled electrodes act as one electrode of a capacitor, thereby occupying less space while providing enough capacity. Further, the capacitors Cst and Cvth are coupled in series through the common electrode 42. Thus, an additional electrode is not necessary to couple them in series. Accordingly, the capacitors Cst and Cvth may occupy less space in the pixel area, thereby increasing the pixel's aperture ratio.

Referring to FIG. 9, FIG. 10, FIG. 11, FIG. 12 and FIG. 13, an organic electro-luminescent display device according to a third exemplary embodiment of the present invention will be described hereinafter.

Figure 9:
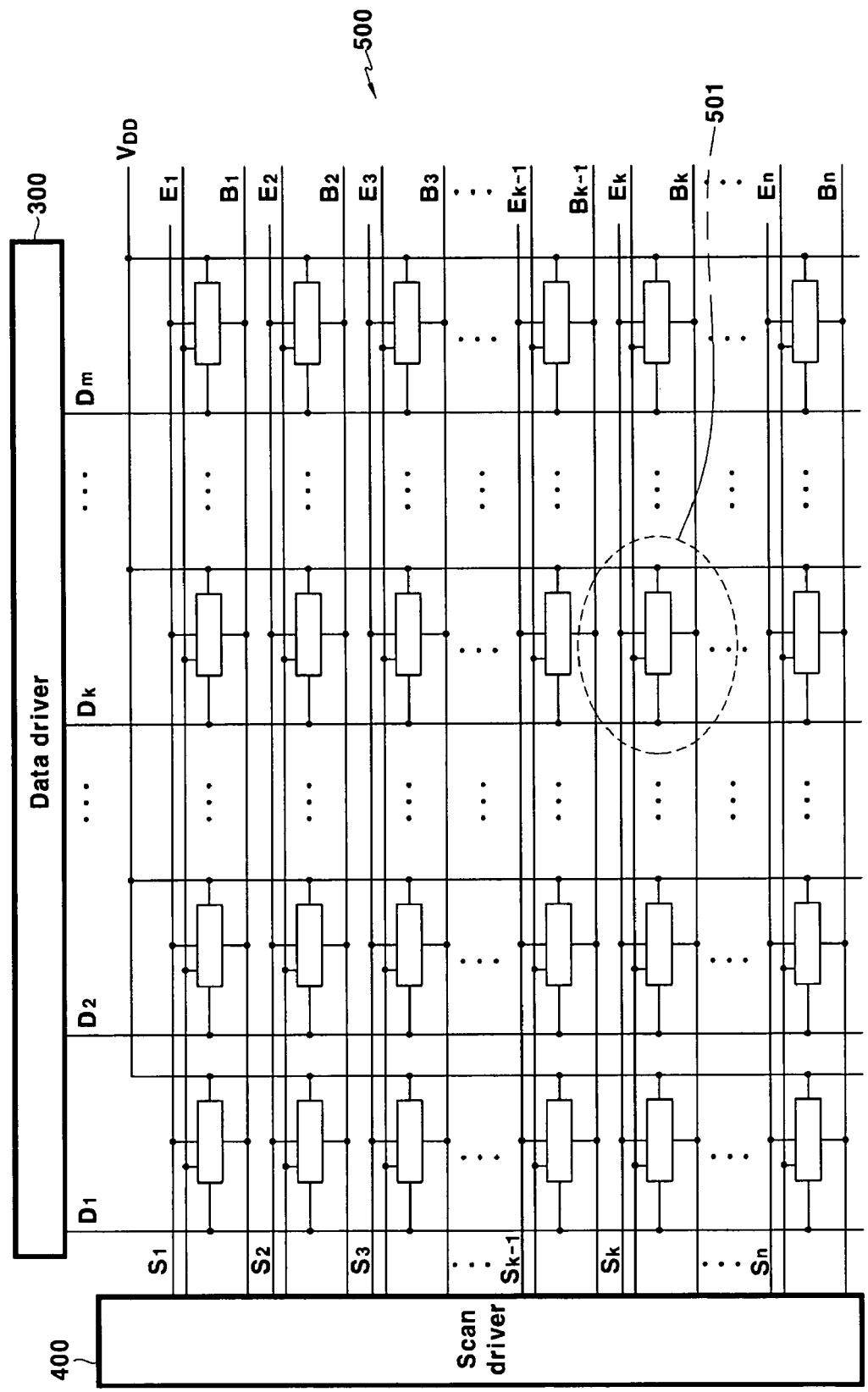
FIG. 9 schematically shows a configuration of an organic electro-luminescent display device according to a third exemplary embodiment of the present invention.

FIG. 9 schematically shows a configuration of the organic electro-luminescent display device according to the third exemplary embodiment of the present invention. Unlike the second exemplary embodiment, the device of the third exemplary embodiment of the present invention employs a current programming method, in which a data current Idata is transferred from a data line as a data signal.

Referring to FIG. 9, the organic electro-luminescent display device according to the third exemplary embodiment may include a display panel 500, a scan driver 400, and a data driver 300. The display panel 500 includes a plurality of scan lines $S_1$ to $S_n$, a plurality of emission control lines $E_1$ to $E_n$, and a plurality of boost control lines $B_1$ to $B_n$ extending in a row direction, a plurality of data lines $D_1$ to $D_m$ extending in a column direction, a plurality of power lines $V_{DD}$, and a plurality of pixels 501.

Herein, the pixels 501 are formed in an area defined by two adjacent scan lines and two adjacent data lines. Each pixel 501 is driven by signals transmitted from the scan lines $S_1$ to $S_n$, the emission control lines $E_1$ to $E_n$, the boost control lines $B_1$ to $B_n$, and the data lines $D_1$ to $D_m$.

The scan driver 400 may sequentially transmit selection signals to the scan lines $S_1$ to $S_n$, thereby selecting a line to apply a data signal to, and it may sequentially transmit emission control signals to the emission control lines $E_1$ to $E_n$ to control the OLED's emission.

Further, the scan driver 400 applies boost signals to the pixel of the selected line through the boost control lines $B_1$ to $B_n$, which determines an increase of a gate voltage at the driving transistor due to the coupled capacitors C1 and C2. Accordingly, a desired current may be supplied to the OLED.

Additionally, the data driver 300 may be the same as the data driver 300 according to the first exemplary embodiment, and it applies a data signal corresponding to a pixel in a selected line.

The scan driver 400 and the data driver 300 may be coupled to a substrate on which the display panel 500 is formed. However, the scan driver 400 and/or the data driver 300 may be provided on a glass substrate of the display panel 500, and they may be replaced with a driving circuit formed on the glass substrate of the display panel, wherein the driving circuit is layered like the scan line, the data line, and the TFTs. Additionally, the scan driver 400 and/or the data driver 300 may be attached on the glass substrate as a chip including a tape carrier package (TCP), a flexible printed circuit (FPC), or a tape automatic bonding (TAB).

Figure 10A:
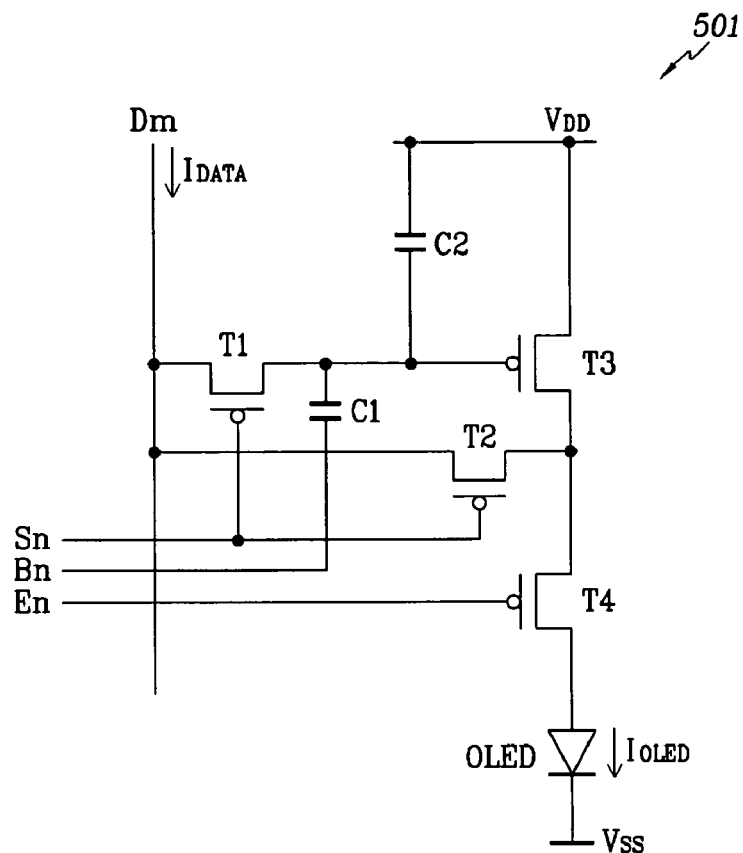
FIG. 10A is an equivalent circuit diagram showing a pixel circuit 501 of the display panel of FIG. 9.
Figure 10B:
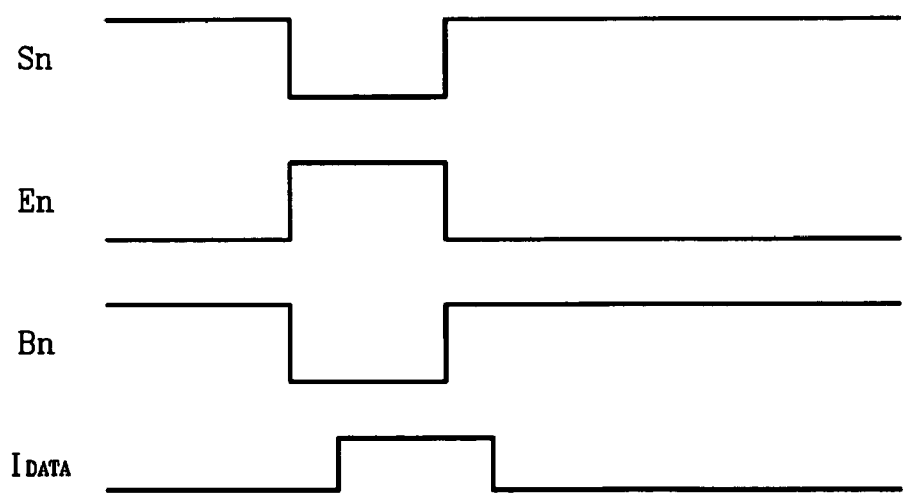
FIG. 10B shows a signal timing diagram for driving the pixel circuit 501 of FIG. 10A.

FIG. 10A is an equivalent circuit diagram showing the pixel circuit 501 in the display panel 500 of FIG. 9, and FIG. 10B illustrates a signal timing diagram for driving the pixel circuit of FIG. 10A.

Referring to FIG. 10A, the pixel circuit 501 may include a driving transistor T3, an emission control transistor T4, a switching transistor T1, a diode-connecting transistor T2, an OLED, and capacitors C1 and C2. A timing of a selection signal of a scan line Sn is similar to that of a boost signal of a boost control line Bn, and a timing of an emission control signal of an emission control line En is an inverted timing of the selection signal as shown in FIG. 10B.

In detail, the switching transistor T1 may be coupled between a data line $D_m$ and a gate of the driving transistor T3, and it transmits a data current $I_{DATA}$ from the data line to the driving transistor T3 in response to a selection signal from a scan line $S_n$. The diode-connecting transistor T2 may be coupled between a drain of the driving transistor T3 and the data line $D_m$, and it diode-connects the driving transistor T3 in response to the selection signal from the scan line $S_n$.

Further, a source of the driving transistor T3 may be coupled to a power voltage $V_{DD}$, and a drain of the driving transistor T3 may be coupled to the diode-connecting transistor T2. A gate-source voltage of the driving transistor T3 is determined corresponding to the data current $I_{DATA}$.

The capacitor C2 may be coupled between the source and a gate of the driving transistor T3, and it maintains the gate-source voltage of the driving transistor T3 for a predetermined period of time. The capacitor C1 may be coupled between a boost control line Bn and the gate of the driving transistor T3, and it may control a gate voltage of the driving transistor T3.

Due to the coupled capacitors, a voltage at a node of the capacitor C2 may increase by as much as an increase in the boost signal voltage $\Delta V_B$ from the boost control line $B_n$. Equation 4 gives an increased amount of a gate voltage $\Delta V_G$ at the driving transistor T3. The increase of the boost signal voltage $\Delta V_B$ may be controlled in accordance with parasitic capacitances of the transistors T1, T2, and T3. Therefore, by controlling the increase of the boost signal voltage $\Delta V_B$, the gate voltage increase $\Delta V_G$ of the driving transistor T3 may be set as desired. In other words, the current $I_{OLED}$ supplied to the OLED may be set as desired.

$$\Delta V_G = \frac{\Delta V_B C_2}{C_1 + C_2} \qquad \text{[Equation 4]}$$

In response to the emission signal from the emission control line $E_n$, the emission control transistor T4 supplies a current flowing from the driving transistor T3 to the OLED. The OLED may be coupled between the emission control transistor T4 and a reference voltage $V_{SS}$, and it emits light corresponding to the amount of the current flowing to the driving transistor T3.

The pixel circuit may operate as follows.

First, the switching transistor T1 and the diode-connecting transistor T2 are turned on by the selection signal applied through the scan line $S_n$. Sequentially, the driving transistor T3 is diode-connected, and the data current $I_{DATA}$ from the data line $D_m$ flows to the driving transistor T3. Simultaneously, the emission control transistor T4 is turned off by the emission signal applied through the emission control line $E_n$, thereby isolating the driving transistor T3 from the OLED.

Herein, Equation 5 gives a relationship between an absolute value of a voltage $V_{GS}$ between the gate and source of the driving transistor T3 ("gate-source voltage") and the current $I_{DATA}$ flowing to the driving transistor T3. Thus, Equation 6 gives the gate-source voltage $V_{GS}$ of the driving transistor T3.

$$I_{DATA} = \frac{\beta}{2}(V_{GS} - V_{TH})^2 \qquad \text{[Equation 5]}$$

where $\beta$ is a constant, and $V_{TH}$ is an absolute value of a threshold voltage of the driving transistor T3.

$$V_{GS} = V_{DD} - V_G = \sqrt{\frac{2I_{DATA}}{\beta}} + V_{TH} \qquad \text{[Equation 6]}$$

where $V_G$ is a gate voltage of the driving transistor T3, and $V_{DD}$ is a voltage supplied to the driving transistor T3 by the power voltage $V_{DD}$.

Next, the switching transistor T1 and the diode-connecting transistor T2 are turned off by the selection signal of the scan line $S_n$, and the emission control transistor T4 is turned on by the emission control signal of the emission control line $E_n$. Herein, the boost signal of the boost control line Bn is changed from a low level to a high level.

A voltage at a point where the capacitor C1 and the boost control Bn meet is then increased by an increase amount of the boost signal level '$\Delta V_E$'. Accordingly, the gate voltage $V_G$ of the driving transistor T3 is increased by way of coupling the capacitors C1 and C2, and the increased amount of the gate voltage $V_G$ is given as Equation 7.

$$\Delta V_G = \frac{\Delta V_E C_2}{C_1 + C_2} \qquad \text{[Equation 7]}$$

where C1 and C2 are capacitances of the capacitors C1 and C2, respectively.

Since the gate voltage $V_G$ of the driving transistor T3 increases by $\Delta V_G$, its drain current $I_{OLED}$ is determined by Equation 8. In other words, the gate-source voltage $V_{GS}$ of the driving transistor T3 is reduced in proportion to the increase in gate voltage $\Delta V_G$. Hence, the drain current $I_{OLED}$ of the driving transistor T3 may be set to be relatively smaller than the data current $I_{DATA}$. Further, the emission control transistor T4 is turned on by the emission control signal of the emission control line $E_n$, thus supplying the drain current $I_{OLED}$ of the driving transistor T3 to the OLED for light emission.

$$I_{OLED} = \frac{\beta}{2}(V_{GS} - \Delta V_G - V_{TH})^2 \qquad \text{[Equation 8]}$$
$$= \frac{\beta}{2}\left(\sqrt{\frac{2I_{DATA}}{\beta}} - \Delta V_G\right)^2$$

As Equation 9 shows, the data current $I_{DATA}$ may be set to be greater than the current $I_{OLED}$ flowing to the OLED.

$$I_{DATA} = I_{OLED} + \Delta V_G \sqrt{2\beta I_{OLED}} + \frac{\beta}{2}(\Delta V_G)^2 \qquad \text{[Equation 9]}$$

Figure 11:
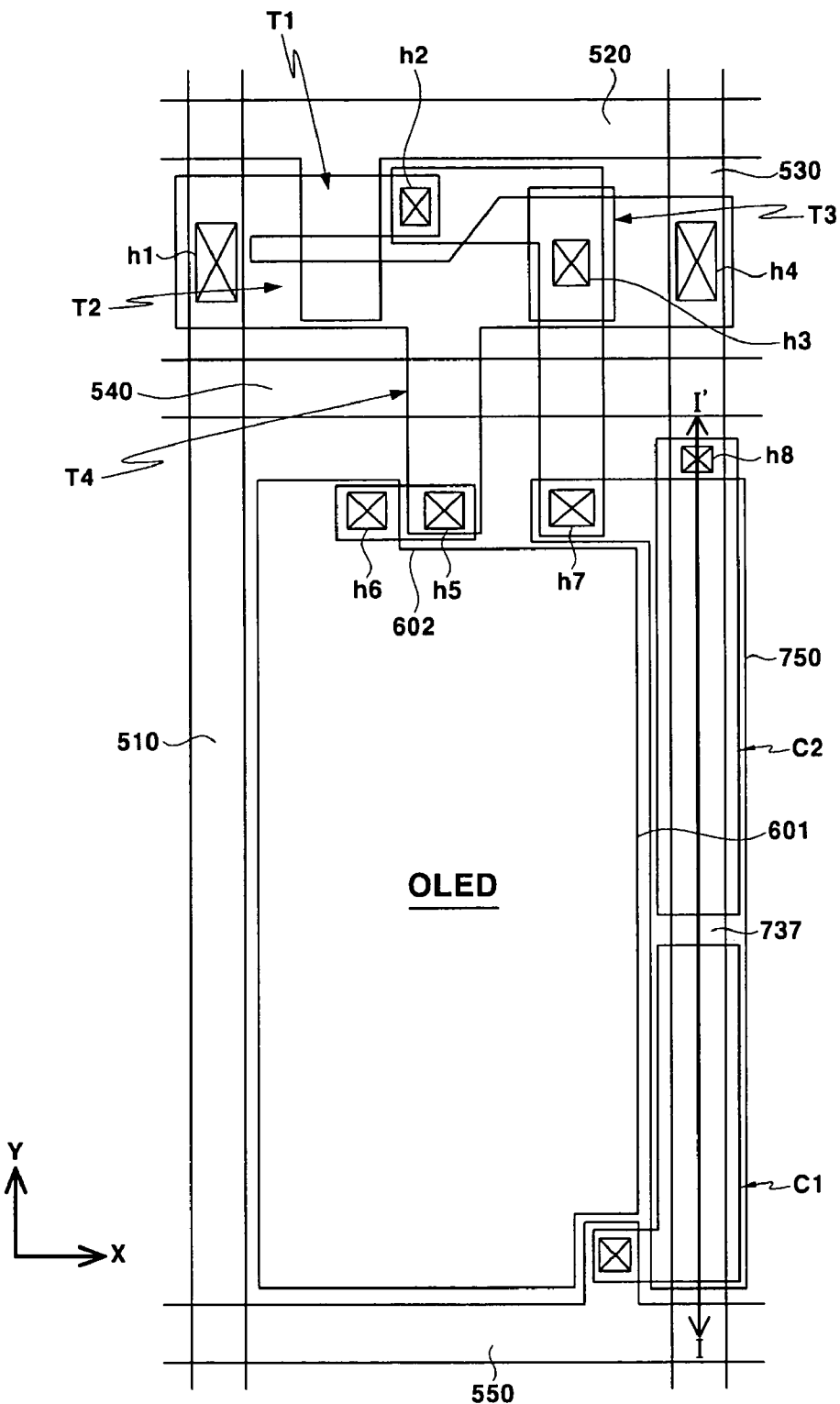
FIG. 11 is a plane view showing an arrangement of the pixel circuit of FIG. 10A.

FIG. 11 is a plane view showing an arrangement of the pixel circuit of FIG. 10 according to an exemplary embodiment of the present invention.

Referring to FIG. 11, the pixel circuit 501 may be formed in an area defined by a data line 510 extending in a first direction (Y axis), a scan line 520 extending in a direction crossing the data line 510 (X axis), a power line 530 spaced with a predetermined interval from the data line 510 and extending in the first direction crossing the scan line 520, and a boost control line 550 arranged in parallel with an emission control line 540, which is arranged in parallel with the scan line 520.

Herein, the switching transistor T1, the driving transistor T3, the diode-connecting transistor T2, and the emission control transistor T4 are provided in an area formed between the scan line 520 and the emission control line 540. Accordingly, the boost control line 550 does not overlap other elements of the pixel circuit 501, thereby preventing distortion in a boost signal from the pixel circuit elements. Thus, the boost signal may be stably inputted to the capacitor C1, thereby more precisely programming the current $I_{OLED}$ to the OLED, more precisely.

In detail, a gate electrode of the switching transistor T1 may be formed on a channel provided near an intersection of the scan line 520 and the data line 510, and a source electrode of the switching transistor T1 may be coupled to the data line through a cavity h1. A drain electrode of the switching transistor T1 may be coupled to a gate electrode of the driving transistor T3 through cavities h2 and h3.

Further, a source electrode of the diode-connecting transistor T2 may be coupled to the data line 510 through the cavity h1. A gate electrode of the diode-connecting transistor T2 and the gate electrode of the switching transistor T1 may be a common electrode. Further, a drain electrode of the transistor T2 may be coupled to a drain electrode of the driving transistor T3 through a polysilicon layer.

The driving transistor T3 may be formed near an intersection of the scan line 520 and the power line 530, and the gate electrode of the driving transistor T3 may be coupled to the drain electrode of the switching transistor T1 through the cavity h3. Further, a source electrode of the driving transistor T3 may be coupled to the power line 530 through a cavity h4, and the drain electrode of the driving transistor T3 may be coupled to a source electrode of the emission control transistor T4 through the polysilicon layer.

The emission control line 540 may serve as a gate electrode of the emission control transistor T4, and a drain electrode of the emission control transistor T4 may be coupled to a pixel electrode through a cavity h5. The pixel electrode may be coupled to the OLED through a cavity h6.

As shown in FIG. 11, the OLED may be disposed in an area between the emission control line 540, the boost control line 550, the data line 510, and the power line 530. Herein, the OLED may have a rectangular shape where a side 601 facing the power line 530 is longer than a side 602 facing the emission control line 540.

Further, the capacitors C1 and C2 may be adjacent to the side 601 of the OLED, and they may overlap the power line 530. The capacitors C1 and C2 are formed as a dual structure having a gate electrode 750 between the power line 530 and the polysilicon layer 735. A gap 737 may be formed in the polysilicon layer, thereby forming two first electrodes of the capacitors C1 and C2 from the polysilicon layer.

Figure 12:
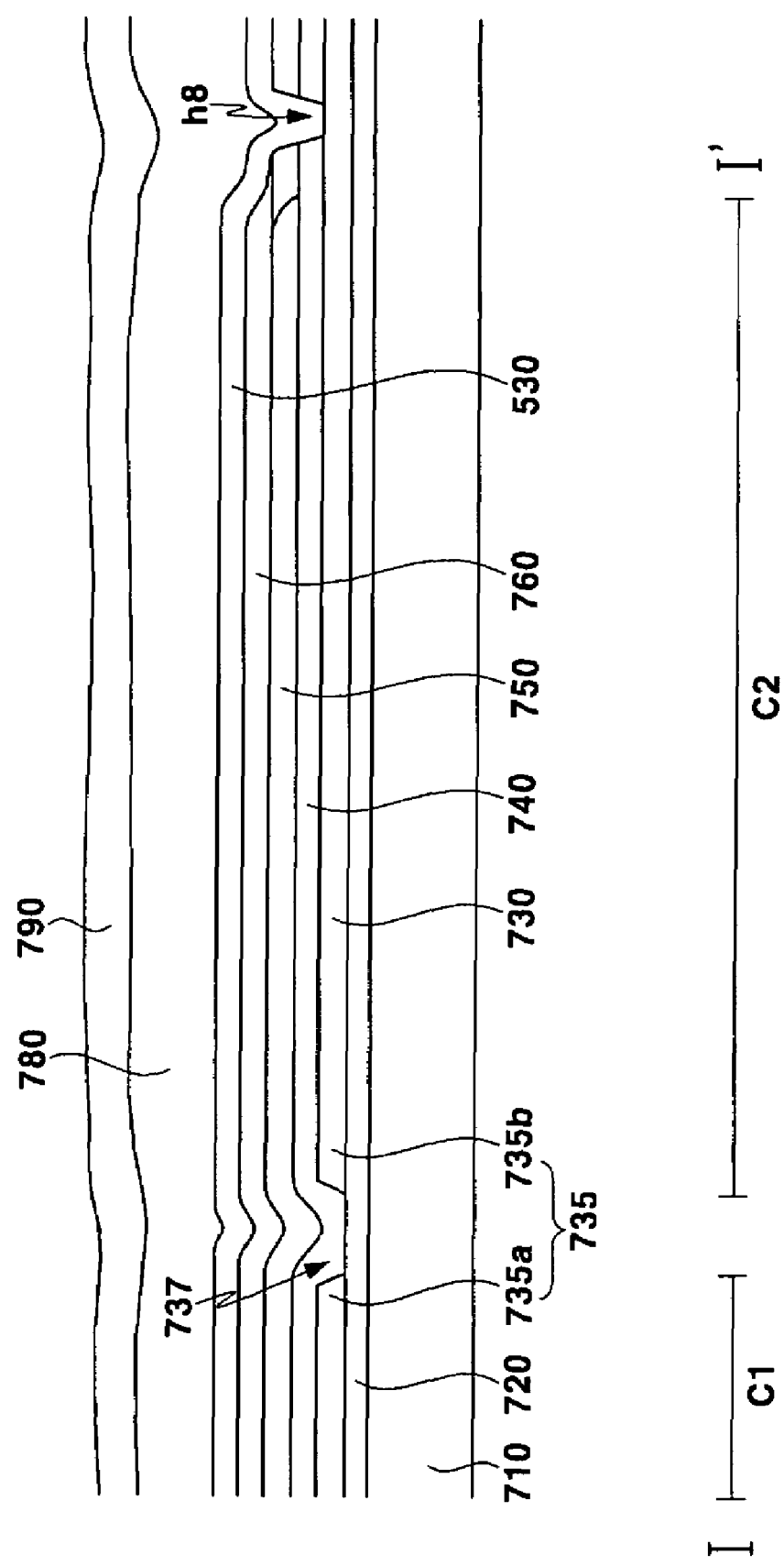
FIG. 12 is a sectional view taken along the line I~I of FIG. 11.
Figure 13:
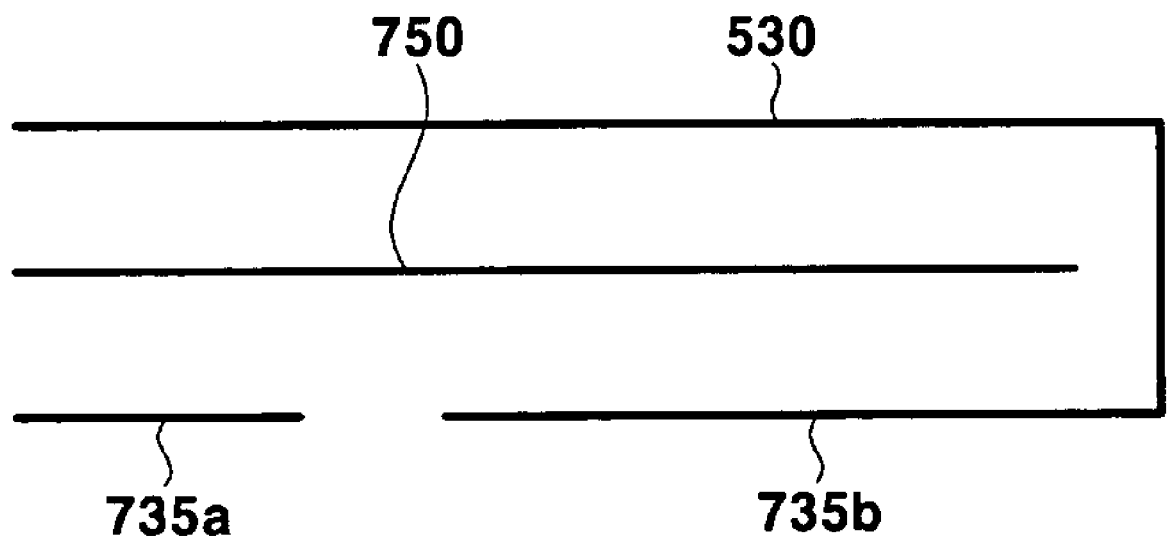
FIG. 13 schematically shows a structure of first and second capacitors of FIG. 12.

FIG. 12 is a sectional view taken along the line I-I' of FIG. 11, and FIG. 13 shows a structure of the capacitors C1 and C2 of FIG. 12.

As shown in FIG. 12, a buffer layer 720, which may include silicon oxide and silicon nitride, may be formed on a substrate 710, and polysilicon layers 735a and 735b may be formed on the buffer layer 720. The polysilicon layer 735a forms a first electrode of the capacitor C1, and the polysilicon layer 735b forms a first electrode of the capacitor C2. Herein, the polysilicon layers 735a and 735b may be doped with predetermined impurities, similar to the polysilicon layer forming the transistors T1, T2, T3 and T4 of the pixel circuit 501.

A gate dielectric 740 may be formed on the polysilicon layer 735, and a gate electrode 750 may be formed on the gate dielectric 740. The gate electrode 750 forms second electrodes of the capacitors C1 and C2.

An interlayer dielectric 760 may be formed on the gate electrode 750, and the power line 530 may be formed on the interlayer dielectric 760. The power line 530 may be coupled to the polysilicon layer 735b through a cavity h8, and it may be equipotential to the polysilicon layer 735b, which is the first electrode of the capacitor C2.

Accordingly, as FIG. 13 shows, the first electrode of the capacitor C1 is the polysilicon layer 735a, and the second electrode of the capacitor C1 is the gate electrode 750. The first electrode of the capacitor C2 is the polysilicon layer 735b and the power line 530, and the second electrode of the capacitor C2 is the gate electrode 750. Herein, the capacitor C2 is a multi-layered (triple) capacitor. In other words, the capacitor C2 is formed between the power line 530 and the gate electrode 750, and between the gate electrode 750 and the polysilicon layer 735b.

The capacitor C2 may be a storage capacitor that stores a driving voltage applied to the OLED for light emission, and the capacitor C1 may be a boost capacitor for boosting the driving voltage stored in the capacitor C2 since it is coupled to the capacitor C2.

An interlayer dielectric 780 may be formed on the power line 530, and a buffer layer 790, which may be omitted, may be formed on the interlayer dielectric 780.

The organic electro-luminescent display device according to the third exemplary embodiment of the present invention uses a triple-layered capacitor occupying less space while providing a required capacity. Therefore, the OLED may occupy more space in the pixel area than the capacitor, thereby increasing the aperture ratio.

Although the present invention has been described in connection with an organic electroluminescent display device, it may be also applied to display devices having two coupled capacitors, and to semiconductors.

Accordingly, exemplary embodiments of the present invention provide a triple-layered capacitor having a first conductive layer, a second conductive layer, and a third conductive layer coupled to the first conductive layer. Therefore, a first electrode of the capacitor is formed by the first and third conductive layers, which have the same potential, and a second electrode of the capacitor is the second conductive layer. Thus, the width of the first electrode doubles compared to that of a double-layered capacitor, thereby providing a high capacity while occupying less space.

Additionally, an aperture ratio of a display panel using the triple-layered capacitor may increase since the capacitor occupies less space.

Further, when a pixel circuit has two coupled capacitors, an electrode provided in the middle among first, second, and third conductive layers may extend to form a node to which two capacitors are coupled without requiring an additional coupling electrode to couple the capacitors in series. Thus, the two capacitors occupy less space, thereby increasing the display panel's aperture ratio.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A capacitor device, comprising:
   a polysilicon layer having a first area and a second area separately formed, and doped with impurities to be conductive;
   a first dielectric layer formed on the polysilicon layer;
   a first conductive layer formed on the first dielectric layer;
   a second dielectric layer formed on the first conductive layer; and
   a second conductive layer formed on the second dielectric layer,
   wherein the second conductive layer is coupled to the first area,
   wherein the first area and the first conductive layer form a first capacitor,
   wherein the second area and the first conductive layer form a second capacitor.

2. The capacitor device of claim 1, wherein the first conductive layer is a metal electrode layer.

3. The capacitor device of claim 1, wherein the first conductive layer and the second conductive layer are metal electrode layers.

4. A display device, comprising:
   a scan line extending in a first direction and transmitting a selection signal;
   a data line extending in a second direction crossing the scan line, and transmitting a data signal; and
   a pixel circuit coupled to the scan line and the data line,
   wherein the pixel circuit comprises:
     a first transistor coupled to the data line;
     a capacitor charging a voltage corresponding to the data signal transmitted through the first transistor;
     a second transistor having a control electrode coupled to a first electrode of the capacitor; and
     a light emission element coupled to the second transistor,
   wherein the capacitor comprises:
     a first conductive layer;
     a first dielectric layer formed on the first conductive layer;
     a second conductive layer formed on the first dielectric layer;
     a second dielectric layer formed on the second conductive layer; and
     a third conductive layer formed on the second dielectric layer,
     wherein the first conductive layer is a first polysilicon layer doped with impurities; and
     wherein the third conductive layer is coupled to the first conductive layer.

5. The display device of claim 4, further comprising:
a second polysilicon layer forming a source area and a drain area of the first transistor and a source area and a drain area of the second transistor;
wherein the first conductive layer is formed on a same layer as the second polysilicon layer; and
wherein the first conductive layer and the second polysilicon layer are a same conductive type.

6. The display device of claim 5,
wherein the second conductive layer is a metal electrode layer formed on a same layer as the scan line; and
wherein the third conductive layer is a metal electrode layer formed on a same layer as the data line.

* * * * *